US008773821B2

(12) United States Patent
Davies

(10) Patent No.: US 8,773,821 B2
(45) Date of Patent: Jul. 8, 2014

(54) MAGNETORESISTIVE-BASED MIXED ANISOTROPY HIGH FIELD SENSOR

(71) Applicant: NVE Corporation, Eden Prairie, MN (US)

(72) Inventor: Joseph E. Davies, Bloomington, MN (US)

(73) Assignee: NVE Corporation, Eden Prairie, MN (US)

(*) Notice: Subject to any disclaimer, the term of this patent is extended or adjusted under 35 U.S.C. 154(b) by 0 days.

(21) Appl. No.: 13/646,187

(22) Filed: Oct. 5, 2012

(65) Prior Publication Data

US 2014/0098443 A1 Apr. 10, 2014

(51) Int. Cl.
*G11B 5/39* (2006.01)

(52) U.S. Cl.
USPC .......................................... 360/324

(58) Field of Classification Search
CPC .................................. G11B 5/39; G11B 39/03
USPC ........ 360/313, 324–324.2; 365/158, 171, 173
See application file for complete search history.

(56) References Cited

U.S. PATENT DOCUMENTS

| 7,813,202 | B2 | 10/2010 | Rodmacq et al. | |
|---|---|---|---|---|
| 8,102,703 | B2* | 1/2012 | Nozieres et al. | 365/173 |
| 8,125,746 | B2* | 2/2012 | Dimitrov et al. | 360/324.2 |
| 8,279,663 | B2* | 10/2012 | Nakayama et al. | 365/158 |
| 8,279,666 | B2* | 10/2012 | Dieny et al. | 365/171 |
| 8,411,394 | B2* | 4/2013 | Sato | 360/324 |
| 2008/0259508 | A2* | 10/2008 | Kent et al. | 360/324.11 |
| 2009/0244788 | A1* | 10/2009 | Sato | 360/324 |
| 2010/0271870 | A1* | 10/2010 | Zheng et al. | 365/171 |
| 2011/0007560 | A1 | 1/2011 | Dieny et al. | |
| 2011/0012215 | A1 | 1/2011 | Nguyen et al. | |
| 2011/0013448 | A1* | 1/2011 | Nozieres et al. | 365/173 |
| 2012/0281512 | A1* | 11/2012 | Zhu et al. | 369/13.24 |
| 2013/0021697 | A1* | 1/2013 | Dimitrov et al. | 360/128 |

FOREIGN PATENT DOCUMENTS

WO 2012092831 A1 7/2012

OTHER PUBLICATIONS

Wei et al., "Magnetic tunnel junction sensor with Co/Pt perpendicular anisotropy ferromagnetic layer," Applied Physics Letters 94, 179902 (2009).
Mancott et al., "A giant magnetoresistance sensor for high magnetic field measurements," Applied Physics Letters, vol. 77, No. 12,; Sep. 18, 2000.
European Search Report dated Mar. 4, 2014 for Application No. EP13187278.
Deac et al., "Different Geometries for Spin-Transfer Oscillators", Spintronics IV, SPIE, vol. 8100, No. 1, pp. 1-7, Sep. 8, 2011.

* cited by examiner

*Primary Examiner* — Will J Klimowicz
(74) *Attorney, Agent, or Firm* — Kinney & Lange, P.A.

(57) ABSTRACT

A mixed anisotropy magnetic field sensor includes a first magnetic material film having in-plane anisotropy with a first magnetic easy axis that is in-plane, a second magnetic material film having out-of-plane anisotropy with a second magnetic easy axis that is perpendicular to the first magnetic easy axis of the first magnetic material film, and a non-magnetic spacer between the first magnetic material film and the second magnetic material film. The first magnetic material film has a magnetization oriented in a first magnetization orientation parallel to the first magnetic easy axis in the presence of no applied magnetic field, and the second magnetic material film has a magnetization oriented in a second magnetization orientation parallel to the second magnetic easy axis in the presence of no applied magnetic field.

21 Claims, 7 Drawing Sheets

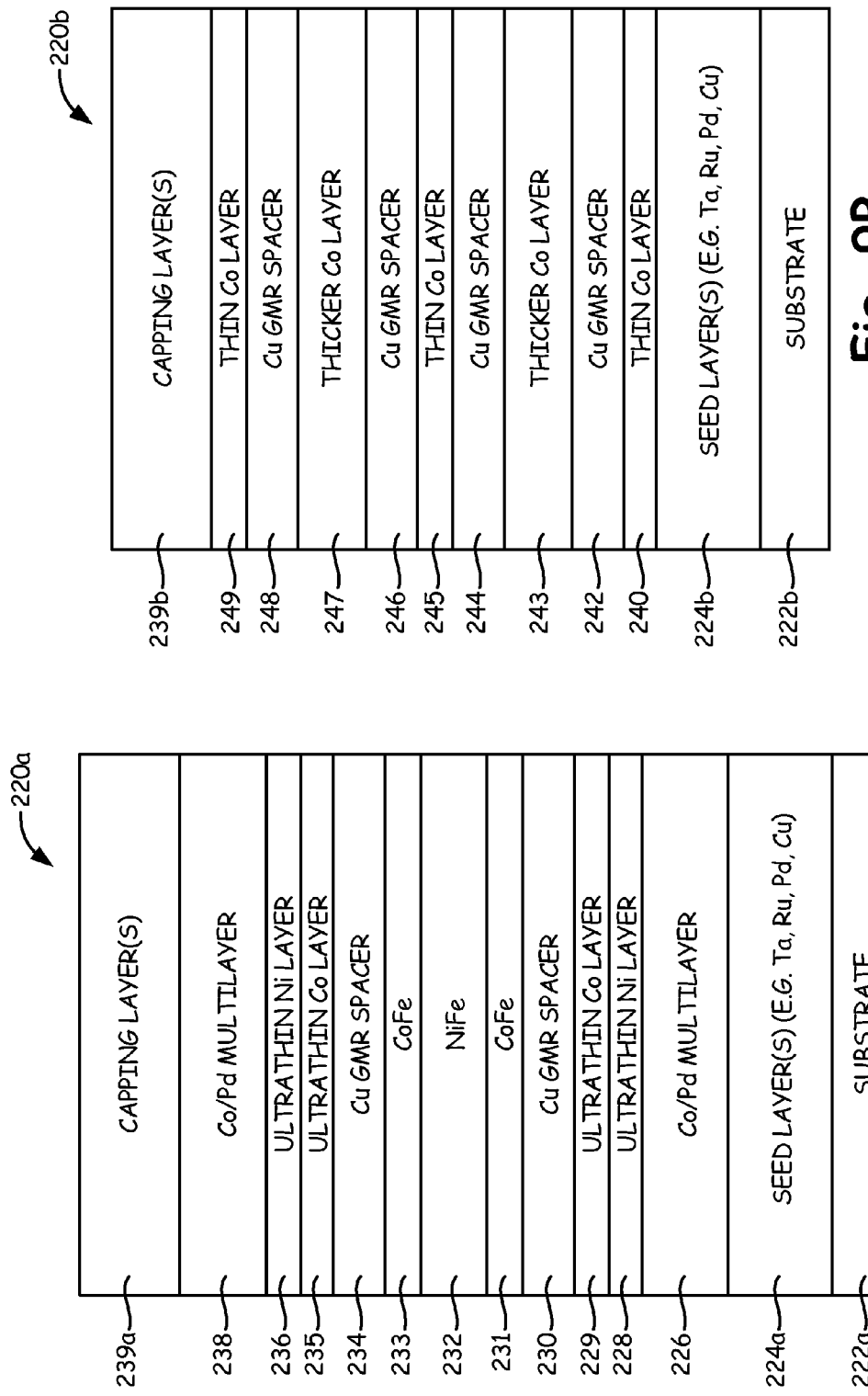

MAGNETORESISTIVE-BASED MIXED ANISOTROPY HIGH FIELD SENSOR

BACKGROUND

The present invention is related to a magnetic field sensor, and more particularly to a mixed anisotropy magnetoresistive sensor.

Sensors are generally known for measuring the magnitude of a magnetic field based on either giant magnetoresistive (GMR) or tunneling magnetoresistive (TMR) materials. These materials are typically made up of two ferromagnetic thin films separated by a non-magnetic spacer. In most applications, one of the magnetic layers is "pinned," holding the orientation of the magnetization of that layer in a fixed direction. The other layer is free to rotate from an equilibrium direction, usually dictated by the coupling between layers as well as the shape in which the magnetic layers are patterned. The degree of deviation of the free layer is proportional to the amount of external field the sensor is exposed to, up to a saturation field ($H_S$). The changes in relative orientations of the magnetizations of the pinned and free layers cause a corresponding change in the measured resistance when current flows through the sensor. FIG. 1 is a graph illustrating this resistance versus applied field curve, with layer orientations inset therein.

If the non-magnetic spacer separating the ferromagnetic thin films is made of a conductive material, the sensor is a GMR sensor. If the non-magnetic spacer separating the ferromagnetic thin films is an insulating material, an added gain in magnetoresistance (MR) change is observed due to quantum mechanical tunneling of spin polarized current, and the sensor is a TMR sensor.

SUMMARY

The present invention is a mixed anisotropy magnetic field sensor. The sensor includes a first magnetic material film having in-plane anisotropy with a first magnetic easy axis that is in-plane, a second magnetic material film having out-of-plane anisotropy with a second magnetic easy axis that is perpendicular to the first magnetic easy axis of the first magnetic material film, and a non-magnetic spacer between the first magnetic material film and the second magnetic material film. The first magnetic material film has a magnetization oriented in a first magnetization orientation parallel to the first magnetic easy axis in the presence of no applied magnetic field, and the second magnetic material film has a magnetization oriented in a second magnetization orientation parallel to the second magnetic easy axis in the presence of no applied magnetic field. The magnetization of the first magnetic material film rotates to align with the magnetization of the second magnetic material film in the second magnetization orientation in the presence of an applied out-of-plane magnetic field exceeding a threshold, and the magnetization of the second magnetic material film rotates to align with the magnetization of the first magnetic material film in the first magnetization orientation in the presence of an applied in-plane magnetic field exceeding a threshold.

BRIEF DESCRIPTION OF THE DRAWINGS

FIGS. 9A, 9B and 9C are diagrams illustrating examples of mixed anisotropy MR sensors constructed of magnetic multilayer films having interlayer coupling that affects switching.

DETAILED DESCRIPTION

A magnetic field sensor is disclosed herein for measuring the magnitude of magnetic fields potentially in excess of 30 kiloOerstads (kOe) with a linear, non-hysteretic response above approximately 1 kOe. The sensor may be based on either GMR or TMR effects. Combined with one or more low field sensors, possibly on the same die, the linear detection range of a magnetic field sensor can be extended and used for multiple purposes. For example, the low field sensor could be used for compassing while the high field sensor could be used to provide a warning if a high intensity magnetic field is encountered.

Magnetic multilayer films have been constructed and used for sensing of high magnitude magnetic fields, and also as the magnetic media for hard disk drives. In films of this type, the role of the layers involved is different than in a typical GMR or TMR device. The free (magnetically soft) layer of the film is strongly coupled to the pinned (magnetically hard) layer by ferromagnetic exchange coupling. When an electromagnetic is passed over the film, the soft layer assists in switching the hard layer. This can be referred to as a "pseudo spin-valve" configuration, since the interlayer coupling of the film affects its switching behavior. In data storage applications, the orientation of the pinned (magnetically hard) layer defines a bit as a '0' or a '1'. The magnetic anisotropy of the pinned layer also defines how long a bit may be reliably stored.

Figure 1:
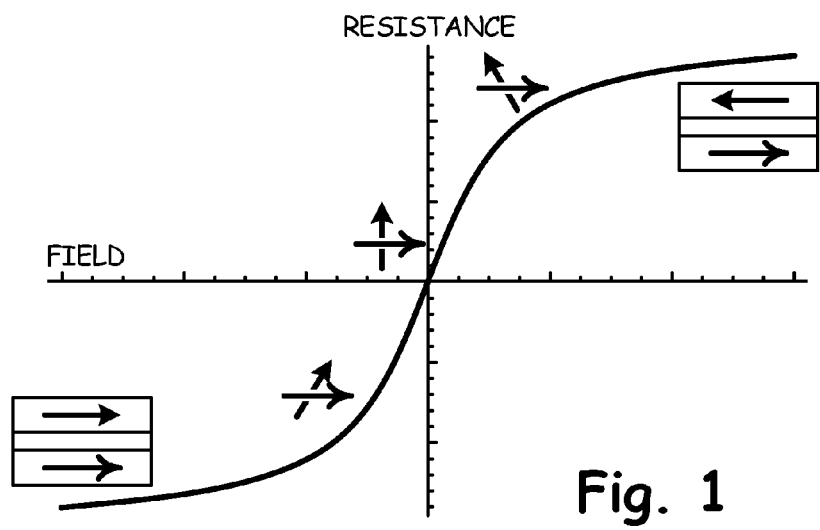
FIG. 1 is a graph illustrating the resistance versus applied field curve for GMR and TMR sensors.
Figure 2:
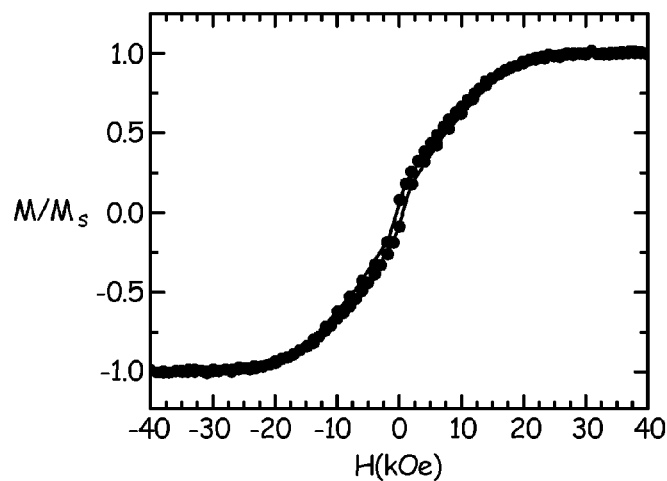
FIG. 2 is a graph illustrating an in-plane major hysteresis loop for an in-plane magnetic field sensor film.
Figure 3:
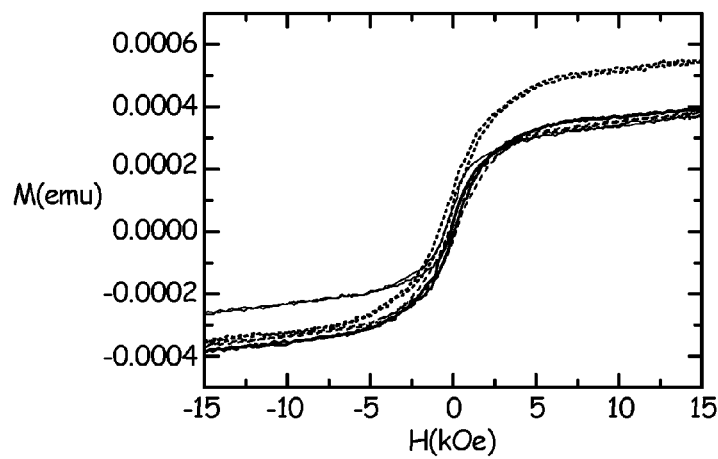
FIG. 3 is a graph illustrating out-of-plane hysteresis loops for an in-plane magnetic field sensor film.

The field required to orient the magnetization of the pinned layer of a multilayer film of this type is generally quite high, such as greater than about 20 kOe for well tailored Co/TM (TM (transition metal)=Pt, Pd, Au) materials, and possibly even greater than about 100 kOe for $FePtL1_o$ materials. FIG. 3 is a graph illustrating an in-plane major hysteresis loop for a Co/Pd multilayer film that shows the in-plane saturation field at about 25 kOe.

In order to orient the magnetization of the magnetic material layers of the film out-of-plane (OOP), an applied magnetic field must be sufficiently large to overcome the shape anisotropy of the film. The shape anisotropy arises from the magnetostatic energy being minimized in-plane. The shape anisotropy field (the field required to overcome shape effects)

is determined by the demagnetization factor (4*π for the case of a thin film) multiplied by the film's saturation magnetization ($M_s$):

$$H_k = 4\pi M_s \quad \text{(Equation 1)}$$

The typical $M_s$ ranges between 700 emu/cm$^3$ (kA/m) and 1500 emu/cm$^3$ (kA/m), yielding a shape anisotropy field magnitude $H_k$ between 1.9 kG and 8.8 kG for an in-plane material. FIG. 4 is a graph illustrating out-of-plane hysteresis loops for an in-plane film.

A magnetic multilayer film may also be configured with perpendicular (out-of-plane) magnetic anisotropy. This means that the energetically favorable condition is for the magnetization direction (the magnetic easy axis) to point normal to the layers of the film. A perpendicular (out-of-plane) film provides a response to out-of-plane applied magnetic fields that is similar to the response of an in-plane film to in-plane applied magnetic fields, and provides a response to in-plane applied magnetic fields that is similar to the response of an in-plane film to out-of-plane applied magnetic fields.

An interesting aspect of in-plane and perpendicular (out-of-plane) anisotropy films is that the magnetization reversal is typically highly reversible and monotonic except at very low fields (e.g., <1 kG) when a field is applied along the magnetically "hard" axis. Therefore, mating an in-plane film with a perpendicular (out-of-plane) anisotropy film in a GMR/TMR film stack can provide a means of measuring high magnitude applied films in nearly any direction. The highest field detectable can be tailored by varying the material growth conditions and is limited by the anisotropy field of each magnetic layer.

Figure 4A:
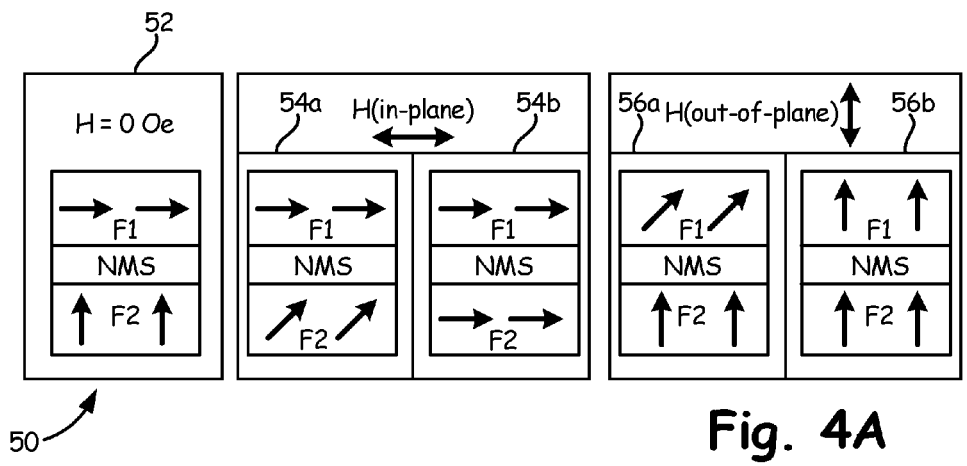
FIG. 4A is a diagram illustrating the magnetization configuration for a mixed anisotropy MR sensor with no applied field, with an in-plane field applied, and with an out-of-plane field applied.

FIG. 4A is a diagram illustrating the magnetization configuration for mixed anisotropy MR sensor 50 with no applied field (box 52), with an in-plane field applied (boxes 54a and 54b), and with an out-of-plane field applied (boxes 56a and 56b). As shown in box 52, sensor 50 includes in-plane anisotropy film F1 and perpendicular (out-of-plane) anisotropy film F2 separated by non-magnetic spacer layer NMS. An in-plane applied magnetic field causes the magnetization of perpendicular anisotropy film F2 of sensor 50 to shift to an in-plane magnetization (as illustrated by a transition phase in box 54a and a final phase in box 54b) that is parallel to the magnetization of in-plane anisotropy film F1, and an out-of-plane applied magnetic field causes the magnetization of in-plane anisotropy film F1 of sensor 50 to shift to an out-of-plane magnetization (as illustrated by a transition phase in box 56a and a final phase in box 56b) that is parallel to the magnetization of perpendicular anisotropy film F2.

Figure 4B:
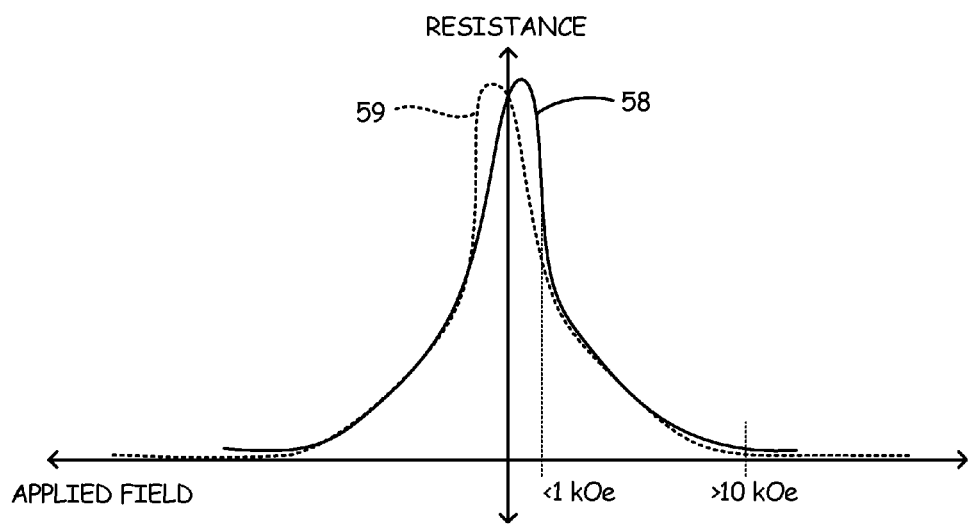
FIG. 4B is a graph illustrating the resistance versus applied field curves of a mixed anisotropy MR sensor.

FIG. 4B is a graph illustrating the resulting resistance versus applied field curves of sensor 50. Curve 58 is the resistance versus applied field curve for an in-plane applied field, and curve 59 is the resistance versus applied field curve for an out-of-plane applied field. As can be seen in FIG. 5B, the response of sensor 50 is similar regardless of the field direction, with a linear response region between about 1 kOe and about 10 kOe. This allows sensor 50 to provide a response (a change in resistance) for any direction of applied field, which can be desirable in applications where the field may be applied in any direction with respect to the sensor, such as when the sensor is located in an implanted medical device, for example.

Figure 5:
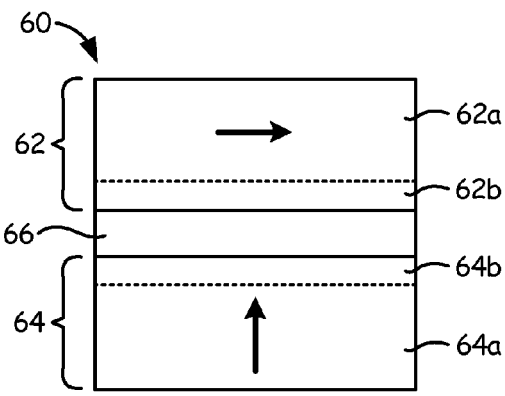
FIG. 5 is a diagram of an exemplary detailed layer configuration of a mixed anisotropy MR sensor.

FIG. 5 is a diagram of an exemplary detailed layer configuration of mixed anisotropy MR sensor 60. Similar to the configuration shown in FIG. 4A, sensor 60 is shown in FIG. 5 as including in-plane anisotropy film 62, perpendicular (out-of-plane) anisotropy film 64, and non-magnetic spacer layer 66. Non-magnetic spacer layer 66 may be a conducting material (for a GMR sensor) or an insulating material (for a TMR sensor). In-plane anisotropy film 62 includes main in-plane film 62a and interface layer 62b, and perpendicular anisotropy film 64 includes main perpendicular film 64a and interface layer 64b. Interface layers 62b and 64b represent regions where the magnetization, and possibly the film uniformity, are increased compared to main films 62a and 64a. This tends to improve the scattering of spin polarized current.

The out-of-plane anisotropy energy of in-plane anisotropy film 62 is less than $2\pi M_{s1}^2 t_1$, where $M_{s1}$ is the saturation magnetization and $t_1$ is the thickness of in-plane anisotropy film 62. The out-of-plane saturation field is defined by $NM_{s1}$, where N is the shape dependent demagnetization factor. N is equal to $4\pi$ unless the lateral dimensions of the film are comparable to the thin film thickness. For sensor 60 to operate correctly, the out-of-plane saturation field is greater than the largest desired detectable field.

The out-of-plane anisotropy of perpendicular anisotropy film 64 is greater than $2\pi M_{s2}^2 t_2$, where $M_{s2}$ is the saturation magnetization and $t_2$ is the thickness of perpendicular anisotropy film 64. For sensor 60 to operate correctly, the out-of-plane saturation field is smaller than the lowest desired magnetic field to be detected when that field is oriented normal to the film plane of sensor 60, and the in-plane saturation magnetization of perpendicular anisotropy film 64 is greater than the largest desired magnetic field vector component to be detected in-plane.

In an exemplary embodiment, perpendicular anisotropy film 64 is comprised of $[Co/TM]_N$ (where TM=Pd, Pt, Au) multilayers with N repeats of the base bi-layer, FePt or a CrPtMn alloy layer. In an exemplary embodiment, in-plane anisotropy film is comprised of a film such as a $[Co/Ni]_N$ multilayer with N repeats of the bilayer or a more traditional MR layer such as a CoFeB/CoFe/NiCoFe trilayer. Non-magnetic spacer layer 66 could consist of Cu for GMR devices or AlO or MgO for TMR devices.

In some embodiments, in-plane anisotropy film 66 and/or perpendicular anisotropy film 64 may be constructed with multiple magnetic and non-magnetic layers. In some embodiments, in-plane anisotropy film 62 and/or perpendicular anisotropy film 64 has increased magnetization (magnetic moment) in a region near non-magnetic spacer layer 66.

Figure 6:
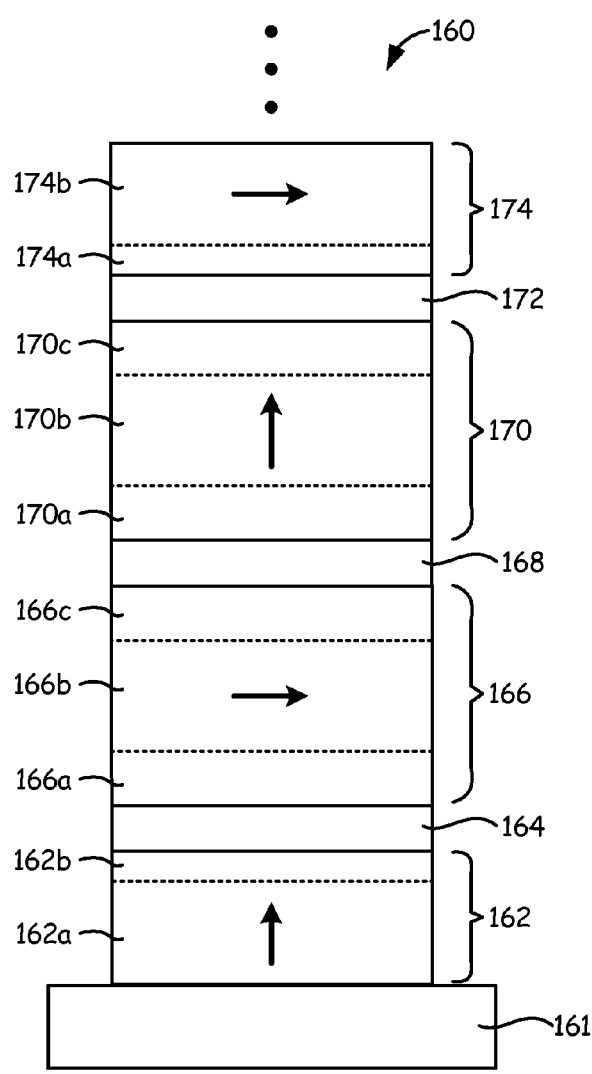
FIG. 6 is a diagram of an alternative exemplary detailed layer configuration of mixed anisotropy MR sensor.

FIG. 6 is a diagram of an alternative exemplary detailed layer configuration of mixed anisotropy MR sensor 160. Sensor 160 is similar to sensor 60 shown in FIG. 5, except that multiple films are stacked in the sensor to potentially improve sensor performance by amplifying the response of the sensor and/or tuning the resistance provided by the sensor. In the configuration shown in FIG. 6, sensor 160 includes a stack of films on substrate 161 that includes perpendicular anisotropy film 162, non-magnetic spacer 164, in-plane anisotropy film 166, non-magnetic spacer 168, perpendicular anisotropy film 170, non-magnetic spacer 172, and in-plane anisotropy film 174. Additional films may be added to sensor 160 as well, in the same pattern.

In the embodiment shown in FIG. 6, perpendicular anisotropy film 162 includes main perpendicular film 162a and interface layer 162b. In-plane anisotropy film 166 includes interface layer 166a, main in-plane film 166b, and interface layer 166c. Perpendicular anisotropy film 170 includes interface layer 170a, main perpendicular film 170b, and interface layer 170c. In-plane anisotropy film 174 includes interface layer 174a and main in-plane film 174b.

Figure 7:
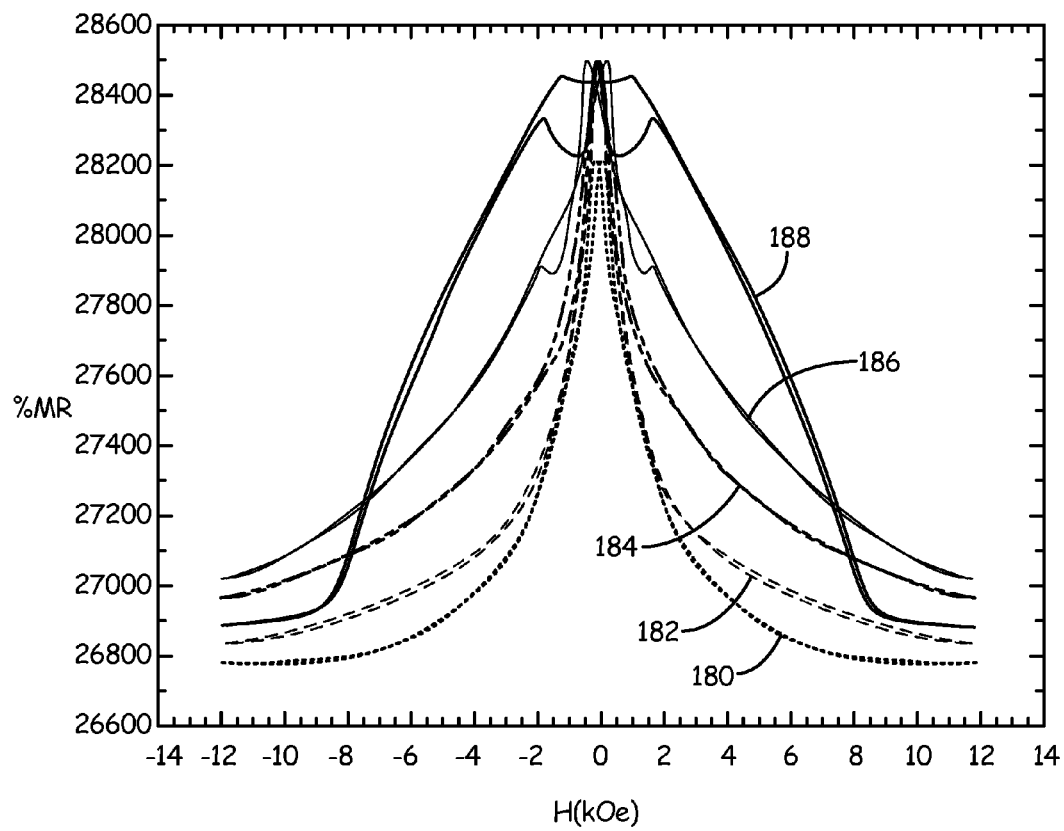
FIG. 7 is a graph illustrating magnetoresistance versus applied magnetic field for various tilt angles with respect to the normal of a sensor film.

In addition to providing a measurement of the magnitude of applied magnetic fields, the sensors disclosed herein can provide a measurement of field direction. FIG. 7 is a graph illustrating magnetoresistance versus applied magnetic field for various tilt angles with respect to the normal of the sensor films. The curves shown in FIG. 7 show the magnetization switching behavior of a sensor for magnetic fields applied azimuthally from the film normal at 0° (curve 180), 22.5° (curve 182), 45° (curve 184), 67.5° (curve 186) and 90° (curve 188).

The device resistance varies between a minimum resistance ($R_{Minimum}$) which occurs when the two film layers' magnetizations are parallel to each other, and a maximum resistance when the magnetizations are anti-parallel. This resistance can be expressed as:

$$R = R_{Minimum}[1 + MR \cos^2(\hat{M}_{FM1} - \hat{M}_{FM2})] \quad \text{(Equation 2)}$$

where $\hat{M}_{FM1} - \hat{M}_{FM2}$ is the angle between the magnetizations of the first ferromagnetic film (FM1), which is an in-plane film, and the second ferromagnetic film (FM2), which is an out-of-plane film. MR is the fractional change in resistance when the resistance goes from $R_{Minimum}$ to $R_{maximum}$.

Variations in the magnetostatic energy due to different material properties in each of the layers results in the different relative switching behavior of each layer. The switching behavior for a uniformly reversing magnetic film is dictated by the shape and intrinsic anisotropy energies in three dimensions. This energy can be written as:

$$E = -M_S[H_x \cos\theta \sin\phi + H_y \sin\theta \sin\phi + H_z \cos\theta] + N_x M_S^2 \cos^2\theta \sin\phi + N_y M_S^2 \sin^2\theta \sin\phi + 4\pi M_S^2 \cos\theta + K_U V \sin^2(\cos^{-1}(\vec{M}\cdot\vec{K}/MK)) \quad \text{(Equation 3)}$$

In Equation 3, the first term is the Zeeman energy from the applied magnetic field, the next three terms are the energies related to the geometric patterning/shape of the material and the last term is due to the intrinsic magnetocrystalline anisotropy of the material. In general, for the high field sensor disclosed herein, the in-plane shape anisotropy terms will be significantly small for both layers (smaller than the sensitive range) and can be cancelled leaving:

$$E = -M_S[H_x \cos\theta \sin\phi + H_y \sin\theta \sin\phi + H_z \cos\theta] + 4\pi M_S^2 \cos\phi + K_U V \sin^2(\cos^{-1}(\vec{M}\cdot\vec{K}/MK)) \quad \text{(Equation 4)}$$

Thus, there is competition between the $4\pi M_S^2$ term which constitutes the out-of-plane shape anisotropy and the magnetocrystalline/intrinsic anisotropy term ($K_u V$). For the FM1 type of film, $K_u V$ will be in-plane and small compared to the out-of-plane shape anisotropy and can be considered negligible as well when a field is applied out of plane. The FM2 film layer has an out-of-plane component to $K_u V$ which is significantly higher than $4\pi M_S^2$, causing the film's magnetization to prefer to orient normal to the film plane. The different energy landscapes between FM1 and FM2 results in different sensor response as a function of angle with respect to the film normal. Thus, the standalone sensor can serve as an azimuthal angle sensor.

Figure 8:
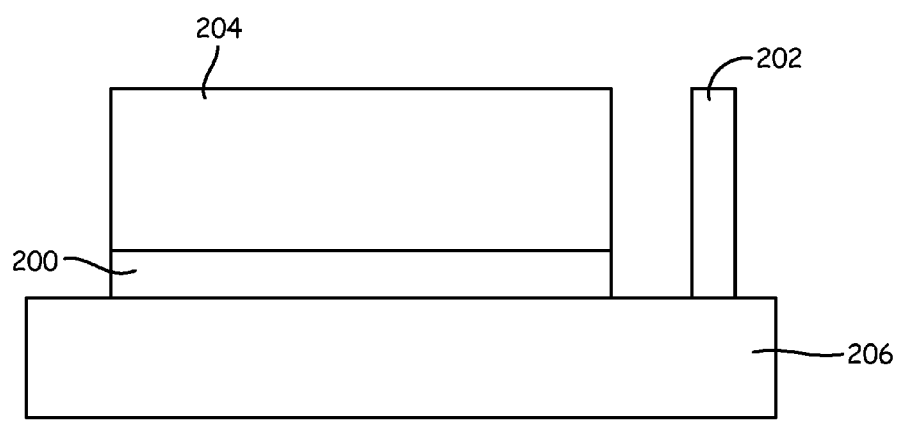
FIG. 8 is a diagram illustrating a packaging configuration in which multiple high field MR sensors are packaged on a common frame.

FIG. 8 is a diagram illustrating a packaging configuration in which multiple high field MR sensors 200, 202 and 204 are packaged on frame 206 in order to improve and fully extend field sensitivity to three dimensions. The thin films of each of sensors 200, 202 and 204 are positioned with their magnetic easy axes oriented orthogonally to each other. This creates unique responses in each of the three sensor directions, and the superposition of these signals allows the magnitude and direction of any applied magnetic field to be measured.

Figure 9C:
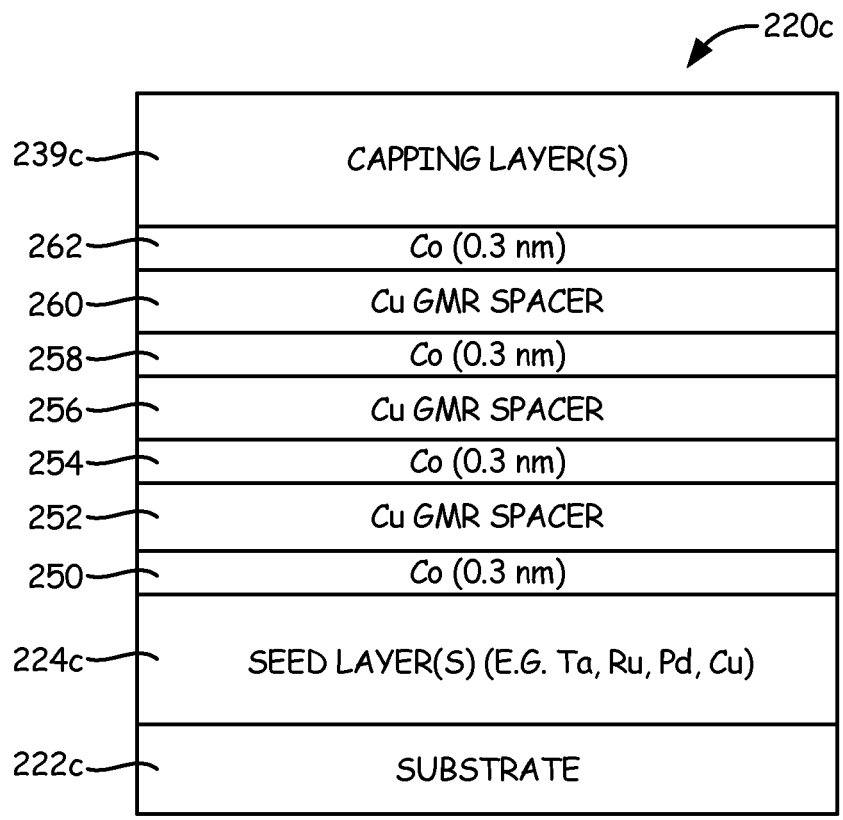

FIGS. 9A, 9B and 9C are diagrams illustrating examples of mixed anisotropy MR sensors constructed of magnetic multilayer films having interlayer coupling that affects switching. Film 220a shown in FIG. 9A includes substrate 222a, seed layer(s) 224a, magnetically "hard" Co/Pd pinned multilayer 226, ultrathin Ni layer 228, ultrathin Co layer 229, Cu spacer layer 230, CoFe layer 231, magnetically "soft" NiFe free layer 232, CoFe layer 233, Cu spacer layer 234, ultrathin Co layer 235, ultrathin Ni layer 236, magnetically "hard" Co/Pd pinned multilayer 238, and capping layer(s) 239a. Layers 226, 228 and 229 are part of a first out-of-plane film, and layers 235, 236 and 238 are part of a second out-of-plane film. Within these films, layers 226 and 238 are the main film layers, and layers 228, 229, 235 and 236 are the interface layers (referring to the terminology introduced in the description of FIGS. 5 and 6 above). Layers 231, 232 and 233 are part of an in-plane film, with layer 232 being the main film layer and layers 231 and 233 being the interface layers. In this configuration, free layer 232 is strongly coupled to pinned layer 226 (and/or to pinned layer 238) by ferromagnetic exchange coupling. In the presence of a magnetic field, free layer 232 assists in switching the magnetization of pinned layer 226 (and/or pinned layer 238).

Film 220b shown in FIG. 9B includes substrate 222b, seed layer(s) 224b, thin Co layer 240, Cu spacer layer 242, thicker Co layer 243, Cu spacer layer 244, thin Co layer 245, Cu spacer layer 246, thicker Co layer 247, Cu spacer layer 248, thin Co layer 249, and capping layer(s) 239b. In this configuration, thicker Co layers 243 and 247 provide films with an in-plane preferred magnetization direction (magnetic easy axis), while thin Co layers 240, 245 and 249 provide films with an out-of-plane preferred magnetization direction (magnetic easy axis), by virtue of the interface anisotropy of the thin Co layers.

Film 220c shown in FIG. 9C includes substrate 222c, seed layer(s) 224c, thin Co layer 250, Cu spacer layer 252, thin Co layer 254, Cu spacer layer 256, thin Co layer 258, Cu spacer layer 260, thin Co layer 262, and capping layer(s) 239c. Film 220c is constructed similarly to film 220b shown in FIG. 9B and described above, in that the material stack is constructed from a Co/Cu multilayer. However, film 220c is made up of Co layers (layers 250, 254, 258 and 262) that all have the same thickness, and which are thin (less than 0.5 nanometers (nm), about 0.3 nm in an exemplary embodiment). This configuration produces a sensor with essentially omnidirectional high field sensitivity. The small thickness of the Co layers likely result in lateral decoupling of the Co layers, because not enough growth has occurred for continuous layers to form. The significantly reduces the impact of the shape anisotropy, while preserving the large interface anisotropy of the Co layers. As a result, the response of each layer is essentially omnidirectional, with the anti-ferromagnetic coupling between adjacent Co layers with no applied field, and the layers' gradual ferromagnetic alignment as larger fields are applied, providing this omnidirectional response.

Figure 10A:
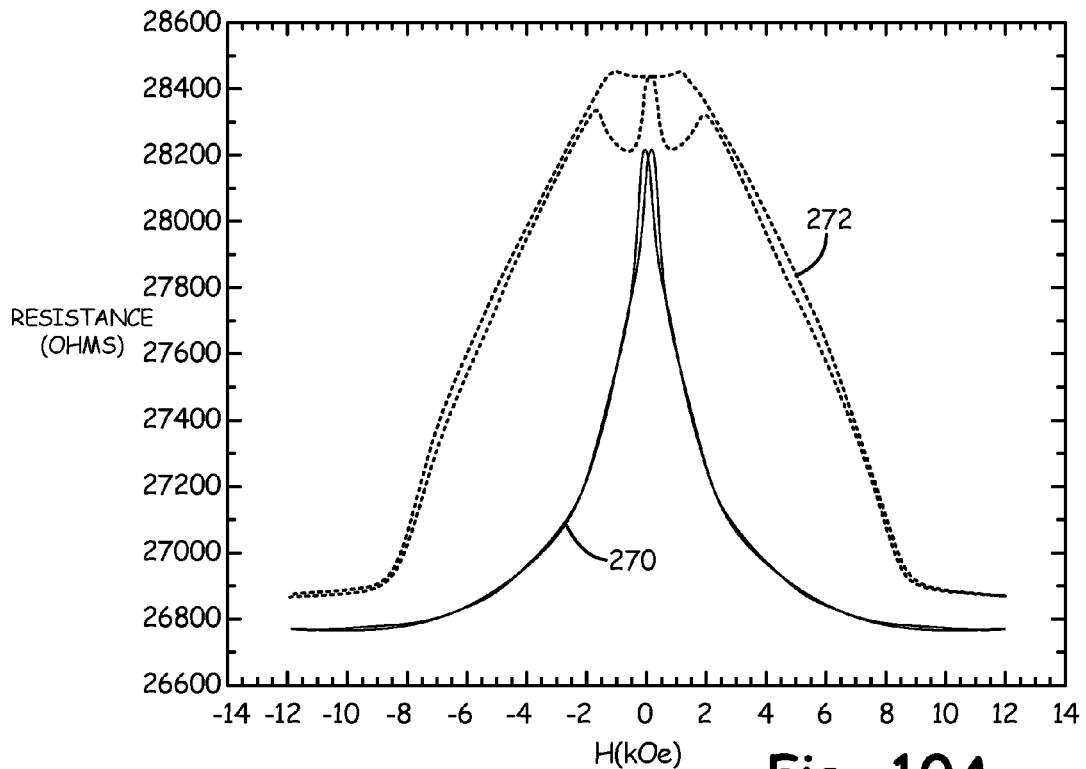
FIGS. 10A and 10B are graphs illustrating the resistance versus applied field curves of the mixed anisotropy MR sensors of FIGS. 9A and 9C, respectively.

FIG. 10A is a graph illustrating resistance versus applied field curves of sensor film 220a. Curve 270 is the resistance versus applied field curve for an in-plane applied magnetic field, and curve 272 is the resistance versus applied field curve for an out-of-plane applied magnetic field. As can be seen in FIG. 10A, the response of sensor film 220a is similar for both the in-plane and out-of-plane applied magnetic fields, with a linear response region between about 1 kOe and about 10kOe (similar to the expected/modeled response shown in FIG. 5B).

Figure 10B:
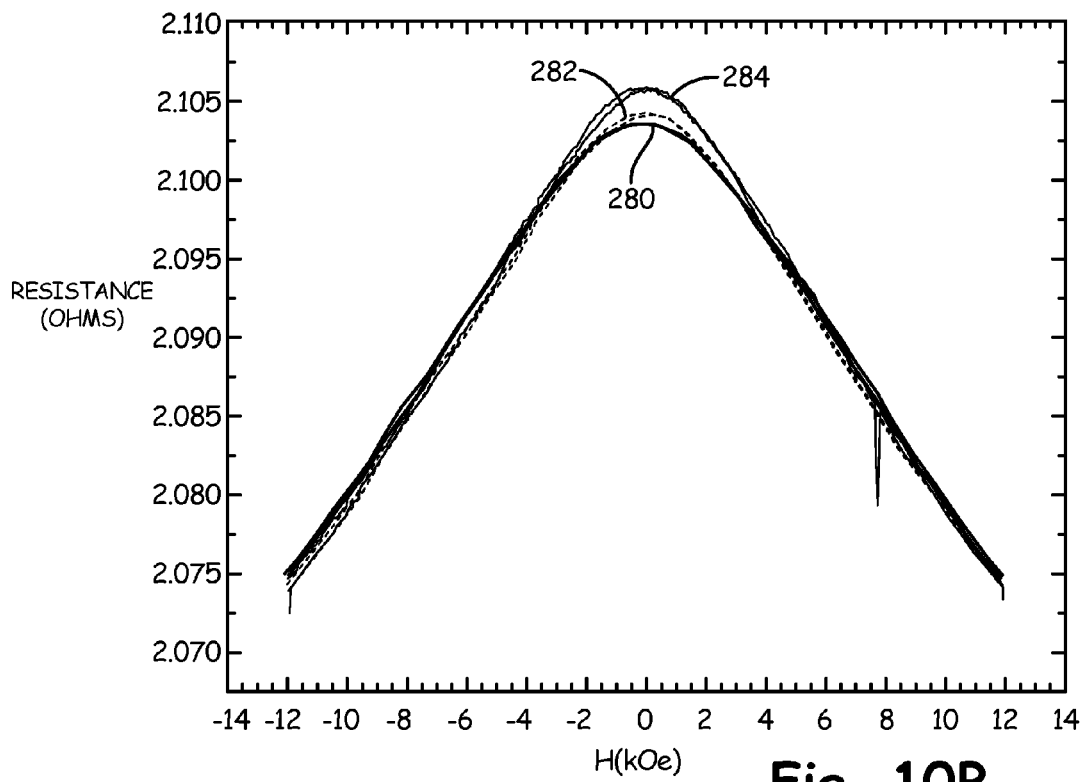

FIG. 10B is a graph illustrating resistance versus applied field curves of sensor film 220c. Curve 280 illustrates the resistance versus applied field for a magnetic field applied 0° from the normal of film 220c, curve 282 illustrates the resistance versus applied field for a magnetic field applied 45° from the normal of film 220c, and curve 284 illustrates the resistance versus applied field for a magnetic field applied 90° from the normal of film 220c. As can be seen in FIG. 10B, the response of the sensor to all of these fields is very nearly the same, showing the omnidirecitonal performance of the sensor.

In an exemplary application, a temperature compensating scheme is employed to ensure device stability over a range of temperatures. This may take the form of a Wheatstone bridge where, in low-field sensors, two of the bridge legs are shielded from magnetic fields to provide a common reference. Shielding in this manner is not practical for high-field applications, as the shielding material will saturate in the large fields and provide no immunity to the reference sensor. For the high-field sensors disclosed herein, the symmetry between the in-plane and out-of-plane layers provides a solution to this problem.

The sensors disclosed herein consume relatively low power in comparison to Hall effect sensors, similar to high sensitivity GMR and TMR sensors, and can be manufactured using the same processes as those sensors. It some embodiments, it is possible to have an array of sensors that operate in different ranges on the same die.

The sensors disclosed herein are able to provide a linear response to magnetic fields in a certain range of field magnitudes. For example, the sensor response shown in FIG. 10A shows an in-plane linear response to fields between about 0.5 kilo-Oerstads (kOe) and about 3.5 kOe, and an out-of-plane linear response to fields between about 2 kOe and about 9 kOe. The sensor response shown in FIG. 10B shows a robust, essentially omnidirectional linear response to fields between about 1 kOe and at least about 10 kOe. Thus, one characterization of embodiments of the sensors disclosed herein may be that they provide a linear response to magnetic fields in a range of at least about 3 kOe within a window of field magnitudes between about 0.5 kOe and about 10 kOe. Another characterization of certain embodiments of the sensors disclosed herein may be that they provide a linear response to magnetic fields between about 1 kOe and about 10 kOe. Other characterizations may be made as well, based on the description of exemplary embodiments provided herein.

One example of an application of the sensors disclosed herein is in the medical device industry. Many of the devices used to treat chronic ailments such as heart disease and hearing loss (pacemakers and hearing aids, respectively) possess microelectronics that are highly sensitive to high magnetic fields. This creates a problem, particularly in surgically implanted devices, when a high field is encountered. An example of this is if a patient with a pacemaker needs an MRI, or is in a facility with high field equipment. The sensor disclosed herein would allow for detection of the field and the device could be placed in a "safe" mode before damage to the device or to the patient would occur. Other exemplary applications include a low cost detector for experimental and test equipment setups, or field detection in an environment with significant radiation (e.g. space or nuclear plants) due to the radiation hardness of the sensor. There are likely also numerous applications in the defense, security and manufacturing industries where high fields are often present and can be indicators of events such as machine actuation, launches or attempted unauthorized access.

The above description of exemplary embodiments of the present invention occasionally refers to dimensions. It should be understood that references to dimensions herein take normal processing variations into account, whether the term "about" is used with the dimension or not, so that dimensions that vary from the particular dimensions described herein within such a processing variation are contemplated by the present disclosure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A mixed anisotropy magnetic field sensor comprising:
a first magnetic material film having in-plane anisotropy with a first magnetic easy axis that is in-plane, the first magnetic material film having a magnetization that has a first magnetization orientation parallel to the first magnetic easy axis in the presence of no applied magnetic field;
a second magnetic material film having out-of-plane anisotropy with a second magnetic easy axis that is perpendicular to the first magnetic easy axis of the first magnetic material film, the second magnetic material film having a magnetization that has a second magnetization orientation parallel to the second magnetic easy axis in the presence of no applied magnetic field; and
a non-magnetic spacer between the first magnetic material film and the second magnetic material film;
wherein the magnetization of the first magnetic material film rotates to align with the magnetization of the second magnetic material film in the second magnetization orientation in the presence of an applied out-of-plane magnetic field exceeding a threshold, and the magnetization of the second magnetic material film rotates to align with the magnetization of the first magnetic material film in the first magnetization orientation in the presence of an applied in-plane magnetic field exceeding a threshold; and
wherein at least one of the first magnetic material film and the second magnetic material film has increased magnetization in a region adjacent to the non-magnetic spacer.

2. The mixed anisotropy magnetic field sensor of claim 1, wherein the first magnetic material film comprises a magnetically soft layer coupled to a magnetically hard layer of the second magnetic material film by ferromagnetic exchange coupling.

3. The mixed anisotropy magnetic field sensor of claim 2, wherein the magnetically hard layer comprises a cobalt/transition metal multilayer, the transition metal being palladium, platinum or gold.

4. The mixed anisotropy magnetic field sensor of claim 1, wherein the first magnetic material film comprises a first cobalt layer, and the second magnetic film comprises a second cobalt layer having a thickness less than a thickness of the first cobalt layer.

5. The mixed anisotropy magnetic field sensor of claim 1, wherein the first magnetic material film comprises a first cobalt layer, and the second magnetic material film comprises a second cobalt layer, the first and second cobalt layers having thicknesses less than 0.5 nanometers.

6. The mixed anisotropy magnetic field sensor of claim 5, wherein the first and second cobalt layers have equal thicknesses.

7. The mixed anisotropy magnetic field sensor of claim 6, wherein the first and second cobalt layers have thicknesses of about 0.3 nanometers.

8. The mixed anisotropy magnetic field sensor of claim 1, wherein the first magnetic material film has increased magnetization in a region adjacent to the non-magnetic spacer.

9. The mixed anisotropy magnetic field sensor of claim 1, wherein the second magnetic material film has increased magnetization in a region adjacent to the non-magnetic spacer.

10. The mixed anisotropy magnetic field sensor of claim 1, wherein the non-magnetic spacer is composed of a conductive material.

11. The mixed anisotropy magnetic field sensor of claim 1, wherein the non-magnetic spacer is composed of an insulating material.

12. The mixed anisotropy magnetic field sensor of claim 1, wherein the sensor provides a linear response to magnetic fields in a range of at least about 3 kilo-Oerstads (kOe) within a window of field magnitudes between about 0.5 kOe and about 10 kOe.

13. The mixed anisotropy magnetic field sensor of claim 1, wherein the sensor provides a linear response to magnetic fields between at least 1 kOe and 10 kOe.

14. The mixed anisotropy magnetic field sensor of claim 1, further comprising at least one additional first magnetic material film having in-plane anisotropy with a first magnetic easy axis that is in-plane, and at least one additional second magnetic material film having out-of-plane anisotropy with a second magnetic easy axis that is perpendicular to the first magnetic easy axis of the first magnetic material film.

15. A mixed anisotropy magnetic field sensor comprising:
a first magnetic material film having in-plane anisotropy with a first magnetic easy axis that is in-plane, the first magnetic material film having a magnetization that has a first magnetization orientation parallel to the first magnetic easy axis in the presence of no applied magnetic field;
a second magnetic material film having out-of-plane anisotropy with a second magnetic easy axis that is perpendicular to the first magnetic easy axis of the first magnetic material film, the second magnetic material film having a magnetization that has a second magnetization orientation parallel to the second magnetic easy axis in the presence of no applied magnetic field; and
a non-magnetic spacer between the first magnetic material film and the second magnetic material film;
wherein the magnetization of the first magnetic material film rotates to align with the magnetization of the second magnetic material film in the second magnetization orientation in the presence of an applied out-of-plane magnetic field exceeding a threshold, and the magnetization of the second magnetic material film rotates to align with the magnetization of the first magnetic material film in the first magnetization orientation in the presence of an applied in-plane magnetic field exceeding a threshold; and
wherein the first magnetic material film comprises a magnetically soft layer coupled to a magnetically hard layer of the second magnetic material film by ferromagnetic exchange coupling.

16. The mixed anisotropy magnetic field sensor of claim 15, wherein the magnetically hard layer comprises a cobalt/transition metal multilayer, the transition metal being palladium, platinum or gold.

17. The mixed anisotropy magnetic field sensor of claim 15, wherein the non-magnetic spacer is composed of a conductive material.

18. The mixed anisotropy magnetic field sensor of claim 15, wherein the non-magnetic spacer is composed of an insulating material.

19. The mixed anisotropy magnetic field sensor of claim 15, wherein the sensor provides a linear response to magnetic fields in a range of at least about 3 kilo-Oerstads (kOe) within a window of field magnitudes between about 0.5 kOe and about 10 kOe.

20. The mixed anisotropy magnetic field sensor of claim 15, wherein the sensor provides a linear response to magnetic fields between at least 1 kOe and 10 kOe.

21. The mixed anisotropy magnetic field sensor of claim 15, further comprising at least one additional first magnetic material film having in-plane anisotropy with a first magnetic easy axis that is in-plane, and at least one additional second magnetic material film having out-of-plane anisotropy with a second magnetic easy axis that is perpendicular to the first magnetic easy axis of the first magnetic material film.

* * * * *